United States Patent
Huang et al.

(10) Patent No.: US 8,703,403 B2
(45) Date of Patent: Apr. 22, 2014

(54) METHOD AND APPARATUS FOR DRYING A WAFER

(75) Inventors: Wei-Chieh Huang, Hualien (TW); Hung Chang Hsieh, Hsin-Chu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 27 days.

(21) Appl. No.: 13/334,266

(22) Filed: Dec. 22, 2011

(65) Prior Publication Data

US 2013/0164685 A1 Jun. 27, 2013

(51) Int. Cl.
*G03F 7/26* (2006.01)

(52) U.S. Cl.
USPC .......................................... 430/322; 430/332

(58) Field of Classification Search
USPC .......................................... 430/322, 311, 331
See application file for complete search history.

(56) References Cited

U.S. PATENT DOCUMENTS

| 5,025,280 A * | 6/1991 | Lamb et al. .................... 396/571 |
| 6,200,736 B1 * | 3/2001 | Tan ................................ 430/319 |

* cited by examiner

*Primary Examiner* — Cynthia Kelly
*Assistant Examiner* — Caleen Sullivan
(74) *Attorney, Agent, or Firm* — Haynes and Boone, LLP

(57) ABSTRACT

The present disclosure provides a method of fabricating a semiconductor device. The method includes dispensing a liquid on a wafer. The method includes raising the wafer. The method includes lowering the wafer after the raising. The wafer is spun as it is lowered, thereby removing at least a portion of the liquid from the wafer. The present disclosure also provides an apparatus for fabricating a semiconductor device. The apparatus includes a wafer chuck that is operable to hold a semiconductor wafer and secure the wafer thereto. The wafer has a front surface and a back surface. The apparatus includes a dispenser that is operable to dispense a liquid to the front surface of the wafer. The apparatus includes a mechanical structure that is operable to: spin the wafer chuck in a horizontal direction; and move the wafer chuck downwards in a vertical direction while the wafer chuck is being rotated.

20 Claims, 5 Drawing Sheets

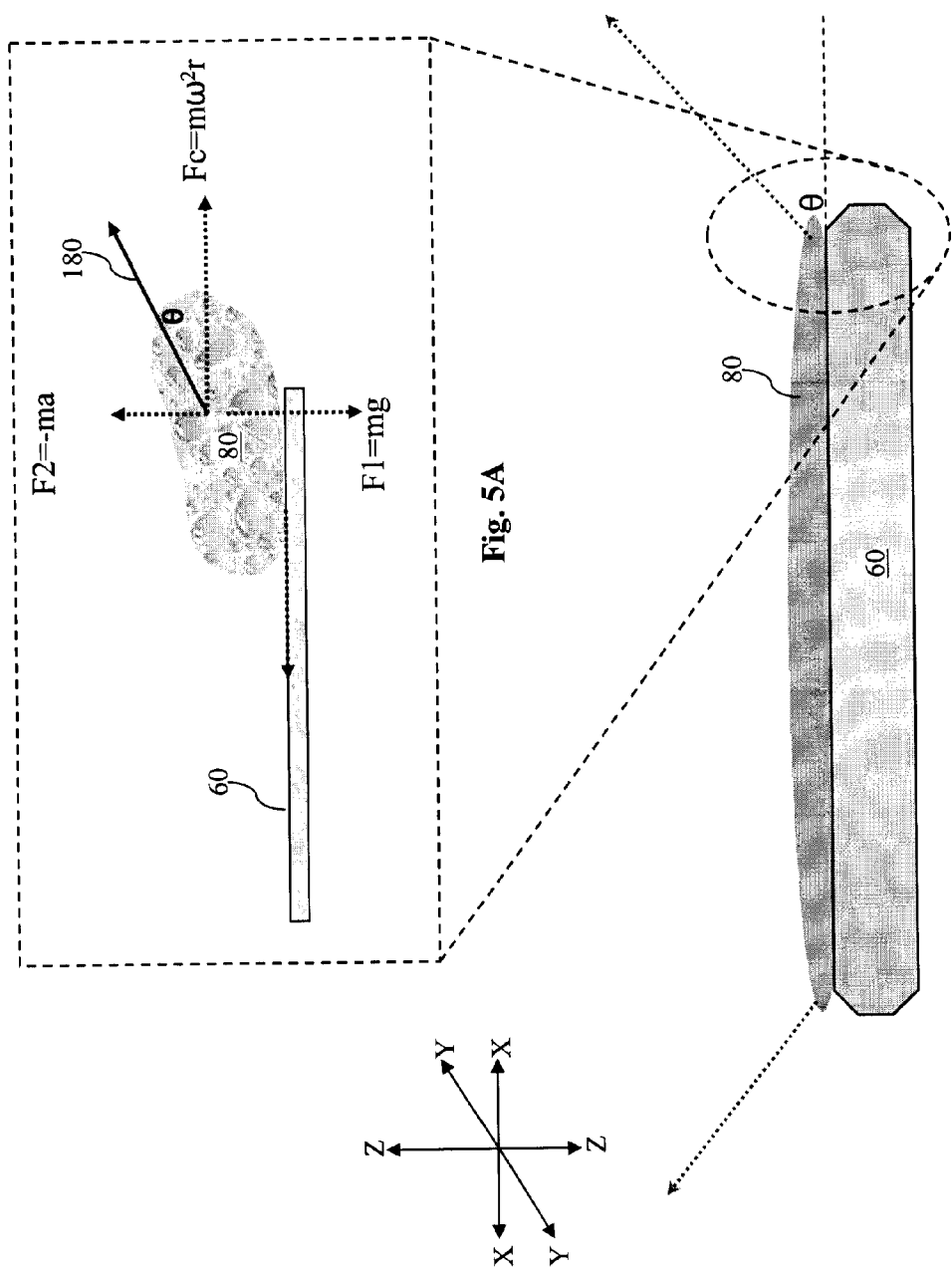

METHOD AND APPARATUS FOR DRYING A WAFER

BACKGROUND

The semiconductor integrated circuit (IC) industry has experienced rapid growth. Technological advances in IC materials and design have produced generations of ICs where each generation has smaller and more complex circuits than the previous generation. However, these advances have increased the complexity of processing and manufacturing ICs and, for these advances to be realized, similar developments in IC processing and manufacturing are needed. In the course of IC evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs.

As the scaling down process continues to advance, defect reduction becomes more important. For example, during a photolithography process, insufficient removal of a developer solution may lead to wafer surface defects such as water stains or photoresist scum. These defects adversely impact semiconductor device performance. The ever-smaller feature sizes (as devices are scaled down) may further increase the difficulty of removing the developer solution or other defects from the wafer surface.

Therefore, while existing semiconductor fabrication processes have been generally adequate for their intended purposes, they are not entirely satisfactory in every aspect.

BRIEF DESCRIPTION OF THE DRAWINGS

Aspects of the present disclosure are best understood from the following detailed description when read with the accompanying figures. It is emphasized that, in accordance with the standard practice in the industry, various features are not drawn to scale. In fact, the dimensions of the various features may be arbitrarily increased or reduced for clarity of discussion.

FIGS. 2-5 are simplified diagrammatic views of a semiconductor wafer and a wafer fabrication system according to various aspects of the present disclosure.

DETAILED DESCRIPTION

Figure 1:
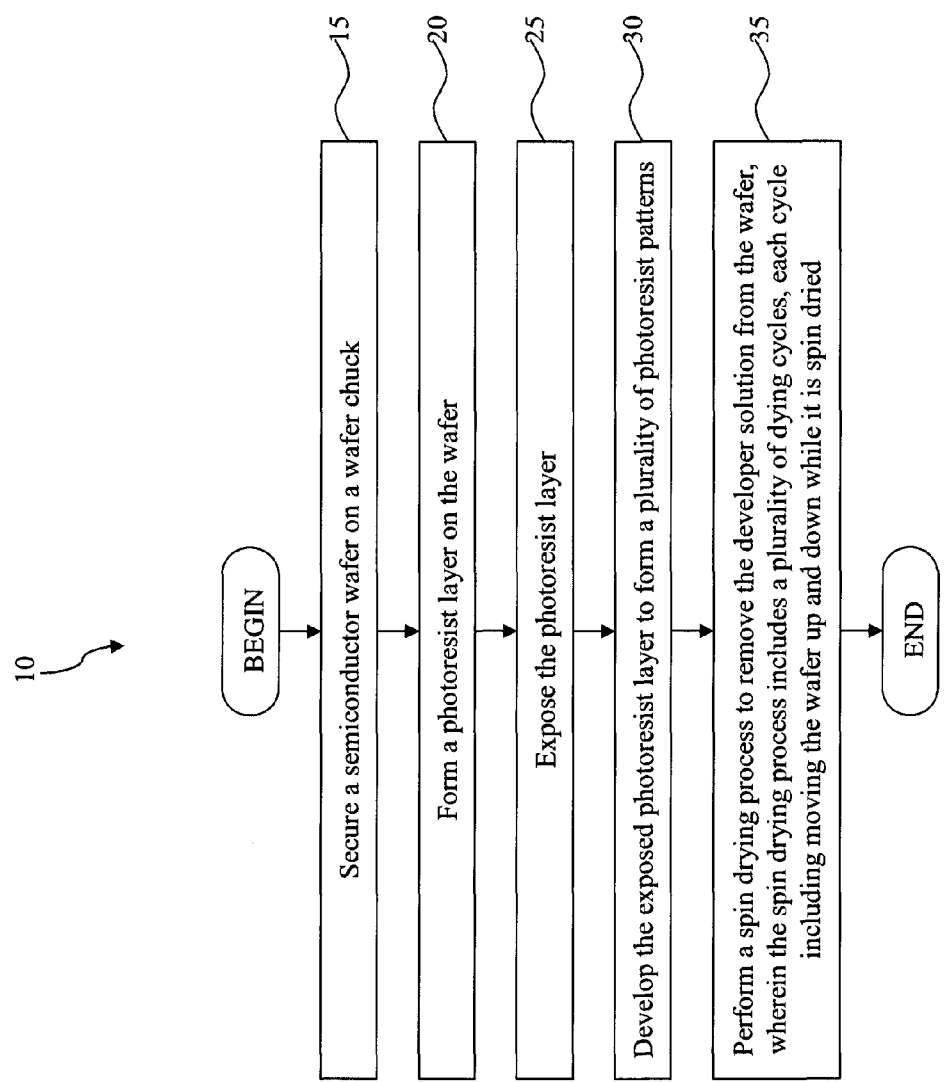
FIG. 1 is a flowchart illustrating a method for performing a wafer cleaning process according to various aspects of the present disclosure.

It is understood that the following disclosure provides many different embodiments, or examples, for implementing different features of various embodiments. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Illustrated in FIG. 1 is a flowchart of a method 10 for cleaning a semiconductor wafer. The semiconductor wafer may contain integrated circuit (IC) chips, systems on chip (SoC), or portion thereof, that may each include various passive and active microelectronic devices such as resistors, capacitors, inductors, diodes, metal-oxide semiconductor field effect transistors (MOSFET), complementary metal-oxide semiconductor (CMOS) transistors, bipolar junction transistors (BJT), laterally diffused MOS (LDMOS) transistors, high power MOS transistors, or other types of transistors.

Referring to FIG. 1, the method 10 includes a block 15, in which a semiconductor wafer is secured on a wafer chuck. In some embodiments, the wafer chuck includes an electronic chuck or a suction type chuck. The method 10 includes a block 20, in which a photoresist layer is formed on the wafer. The method 10 includes a block 25, in which the photoresist layer is exposed as a part of a photolithography process. The method 10 includes a block 30, in which the exposed photoresist layer is developed to form a plurality of photoresist patterns as a part of the photolithography process. As a part of the developing process in block 30, a developer solution is dispensed on the wafer. Also as a part of the developing process in block 30, the wafer is moved up and down in a vertical direction. The method 10 includes a block 35, in which a spin drying process is performed to remove the developer solution from the wafer. The spin drying process includes a plurality of drying cycles. Each drying cycle includes: moving the wafer upwards vertically at a first speed while the wafer is being rotated horizontally; and moving the wafer downwards vertically at a second speed while the wafer is being rotated horizontally. It is understood that additional fabrication processes may be performed before, during, or after the blocks 15-35 of the method 10, but these additional fabrication processes are not discussed herein for the sake of simplicity.

Figure 2:
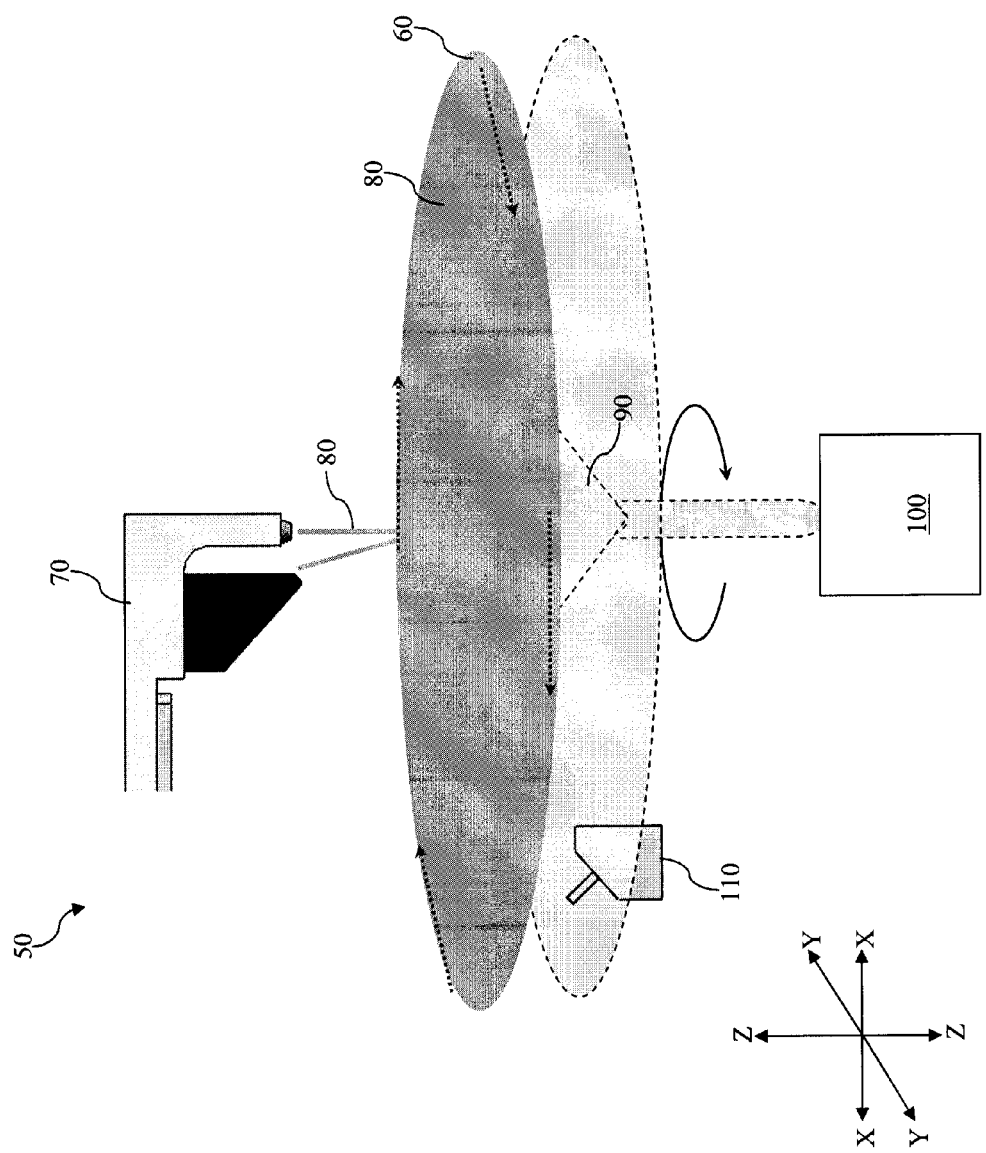

FIG. 2 is a diagrammatic fragmentary perspective view of a semiconductor fabrication system 50 at a certain stage of fabrication. Referring to FIG. 2, the semiconductor fabrication system 50 is used to perform fabrication processes to a wafer 60, which may also be referred to as a substrate. In some embodiments, the wafer 60 may include a silicon material. In other embodiments, the wafer 60 may alternatively be made of some other suitable elementary semiconductor, such as diamond or germanium; a suitable compound semiconductor, such as silicon carbide, indium arsenide, or indium phosphide; or a suitable alloy semiconductor, such as silicon germanium carbide, gallium arsenic phosphide, or gallium indium phosphide. In various embodiments, the wafer 60 includes various doped features for various microelectronic components, such as complementary metal-oxide-semiconductor field-effect transistors (CMOSFETs), imaging sensors, memory cells, capacitive elements, inductive elements, and resistive elements.

In the embodiments discussed herein, the wafer 60 is undergoing a lithography process. For example, a photoresist layer (not specifically illustrated) has already been formed over the upper surface of the wafer 60. The photoresist layer has undergone an exposure process, in which a photomask (not specifically illustrated) is used to transfer its image to the photoresist layer—i.e., to define a plurality of patterned features in the photoresist layer. Once formed, these patterned photoresist features may be used to define the layers of the wafer 60 underneath.

As a part of forming these patterned photoresist features, the photoresist layer (and therefore the wafer 60) is undergoing a developing process that follows the exposure process in the fabrication stage shown in FIG. 2. A nozzle 70 is used to dispense a developer solution (also referred to as a developing solution) 80 onto the upper surface of the wafer 60. The developer solution 80 may contain a developer chemical (e.g., Tetramethylammonium hydroxide, commonly referred to as TMAH) and a solvent (e.g., de-ionized water, commonly referred to as DIW). The manner in which the nozzle 70 dispenses the developer solution 80 onto the surface of the wafer 60 is determined by a process recipe. In some embodiments, the process recipe dictates that the nozzle 70 dispenses a certain amount of developer solution 80, followed by a pause for a brief period of time (e.g., a few seconds). This process may be repeated a plurality of times. In other embodiments, the process recipe may dictate that the nozzle 70 dispense the developer solution 80 continuously. In yet more alternative embodiments, the process recipe may call for other developer solution dispensing arrangements.

To ensure that the developer solution 80 is as uniformly distributed as possible across the surface of the wafer 60, the wafer 60 may be rotated (i.e., spun). In more detail, the wafer 60 is situated on, and secured by, a wafer stage 90. In the embodiments discussed below, the wafer stage includes a wafer chuck and may thereafter be referred to as a wafer chuck 90. It is understood, however, that alternative mechanisms other than wafer chucks may be used to implement the wafer stage 90 in other embodiments. The wafer chuck 90 may be an electronic chuck (E-chuck), which uses electricity to hold the wafer 60. The wafer chuck 90 may alternatively be a suction type chuck, which utilizes a suction force to hold the wafer 60. The wafer chuck 90 includes a holder that supports the wafer 60. In some embodiments, the holder may contact only a portion of the bottom surface of the wafer 60, for example a region near the center of the wafer 60. In other words, the portions of the bottom surface of the 60 not in contact with the holder may still be exposed. The wafer chuck 90 also includes a rod or an elongate member that can move up and down vertically.

The elongate member is coupled to a motor 100. The motor 100 is operable to rotate the wafer chuck 90 in a clockwise or a counter-clockwise direction in a plane defined by an X-direction and a Y-direction, where the Y-direction is perpendicular to the X-direction. Stated differently, the X and Y directions define a horizontal plane, and the motor 100 is operable to rotate or spin the wafer 60 (through the wafer chuck 90) in a clockwise or counter-clockwise direction in that horizontal plane.

The motor 100 is also operable to move the wafer chuck 90 in a Z-direction. The Z-direction is perpendicular to both the X and Y direction, and therefore the Z-direction is orthogonal to the horizontal plane defined by the X and Y directions. Since the X and Y directions may be considered horizontal directions, the Z-direction may be considered a vertical direction. As the wafer chuck 90 is raised or lowered by the motor 100 in the vertical direction, so is the wafer 60. It is understood that the wafer 60 can be rotated in a horizontal direction and raised or lowered in a vertical direction simultaneously.

Through raising or lowering the wafer 60, the developer solution 80 may be distributed more evenly throughout the wafer 60. In some embodiments, the nozzle 70 can also be raised or lowered vertically relative to the wafer 60. The nozzle 70 may also shift its location horizontally relative to the wafer 60. Such horizontal or vertical movements of the nozzle 70 may be programmed by a suitable processing recipe. The movement of the nozzle 70 relative to the wafer may also be employed in certain embodiments to enhance the uniformity of developer solution 80 on the wafer 60.

In some embodiments, the wafer 60 may have a rotational speed (or a spin rate) in a range from about 0 revolutions per minute (rpm) to about 3000 rpm, and the wafer 60 may be raised or lowered vertically at a speed in a range from about 0 meters/second to about 3 meters/second.

In addition to the nozzle 70, the wafer chuck 90, and the motor 100, the semiconductor fabrication system 50 also includes a back side rinsing module 110. The back side rinsing module 110 is operable to dispense a cleaning solution to the back side (i.e., bottom surface) of the wafer 60. The purpose of rinsing the back side of the wafer 60 is to prevent reflow of the developer solution 80 onto the back side. This is because if the developer solution 80 gets on the back side of the wafer 60, it might leave stains or residue as the wafer is dried in a later process. These stains or residue may contaminate the wafer chuck 90 or other components of the semiconductor fabrication system 50. Thus, the back side rinsing module 110 can prevent such problems by sufficiently cleaning the back side of the wafer 60.

Figure 3:
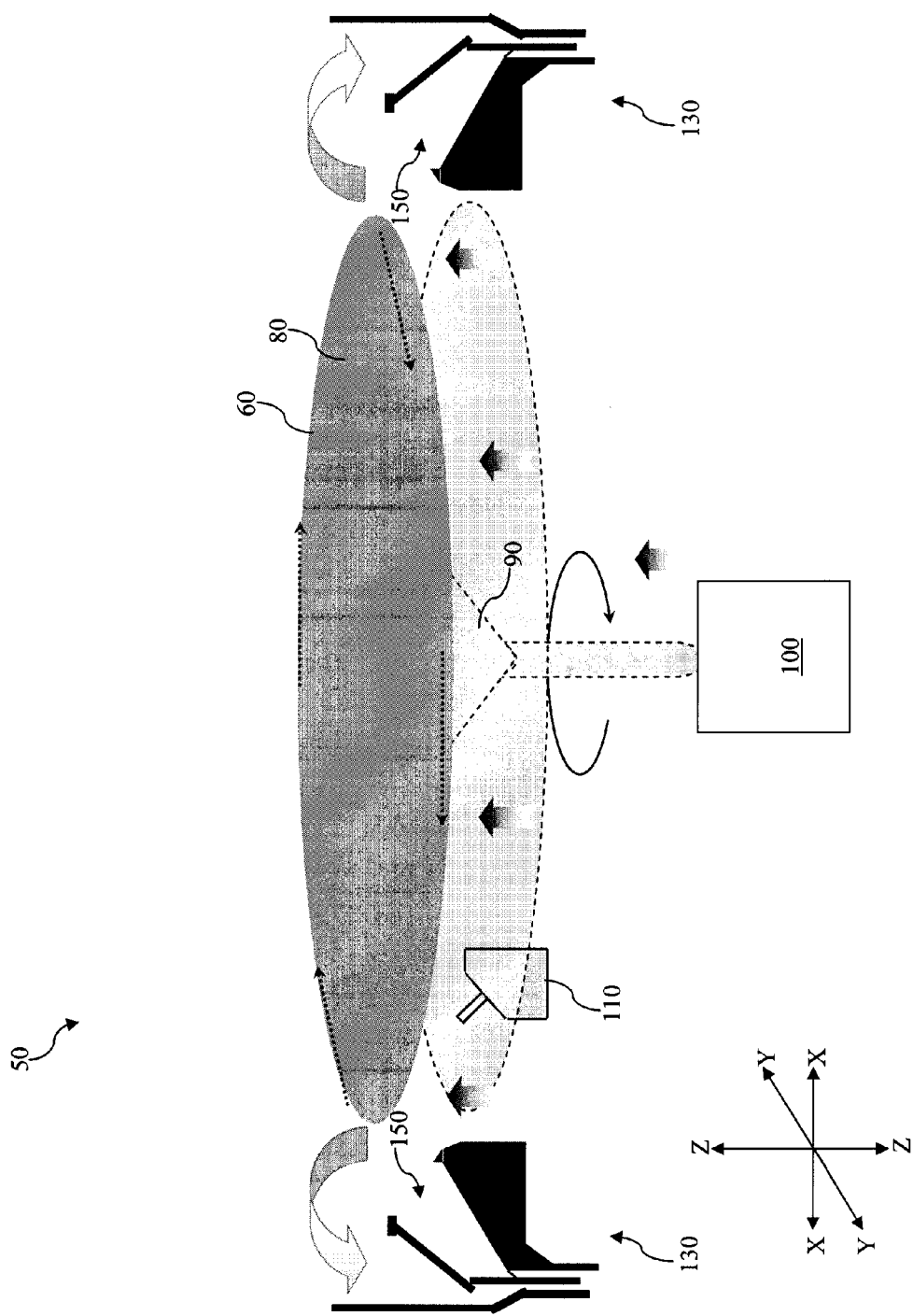
Figure 4:
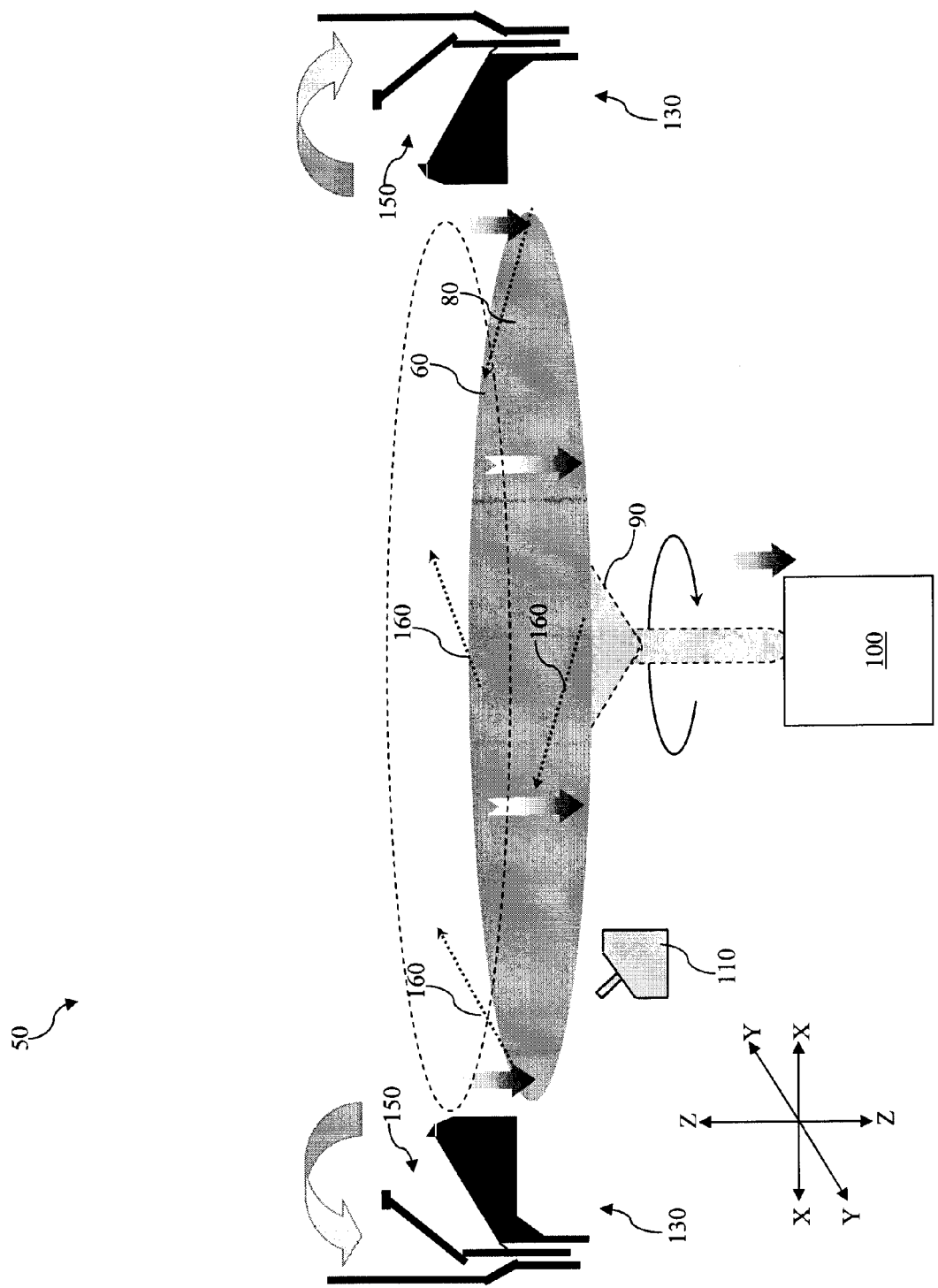

FIGS. 3-4 are diagrammatic fragmentary perspective views of the semiconductor fabrication system 50 at a stage of fabrication different from that of FIG. 2. Referring to FIG. 3, the semiconductor fabrication system 50 is now in a drying stage of a photolithography process that follows the developing stage depicted in FIG. 2. In more detail, after the developer solution 80 has been sufficiently applied to the wafer 60 and after the photoresist patterns on the wafer 60 have been developed, the developer solution 80 needs to be removed from the surface of the wafer 60. As discussed above, incomplete or inadequate removal of the developer solution 80 from the wafer surface may lead to many wafer surface defects, such as water stains, photoresist scum, bubbles, residue, etc. These wafer surface defects may interfere with subsequent semiconductor processing steps and/or degrade the wafer performance. Therefore, adequate removal of the developer solution 80 is desired.

According to various aspects of the present disclosure, the developer solution 80 removal may involve a spin drying process that includes two stages. In the first stage shown in FIG. 3, the wafer 60 is slowly raised vertically by the wafer chuck 90. The wafer 60 is also rotated in the horizontal direction by the wafer chuck 90. In some embodiments, the wafer 60 is rotated as it is raised (i.e., simultaneously). In other embodiments, the wafer 60 may start rotating after it has been raised to a predetermined height. Since the purpose here is to sufficiently remove the developer solution 80, the wafer 60 is rotated quickly, for example being rotated at a spin rate substantially faster than the spin rate while it underwent the developing process in FIG. 2. The vertical speed at which the wafer 60 is raised is not substantially different from the speed at which the wafer is raised or lowered during the developing process in FIG. 2. In some embodiments, the wafer 60 is rotated at a spin rate that is in a range from about 0 rpm to about 3000 rpm, and the wafer 60 is raised vertically at a speed in a range from about 0 meters/second to about 3 meters/second.

To prevent or reduce splashing of the developer solution 80, the semiconductor fabrication system 50 also includes exhaust components 130. The exhaust components 130 are disposed around the wafer 60 and proximate to an edge of the wafer 60. The exhaust components 130 include openings 150 for collecting the developer solution 80 as the developer solution 80 is spun off of the wafer 60. In some embodiments, the exhaust components 130 include chambers and vacuum pumps to create a suction force at the openings 150. This suction force facilitates the collection of the developer solution 80 and speeds up the removal of the developer solution 80 from the wafer 60. It is understood that the back side rinsing module 110 may continue to dispense a cleaning liquid to the back side of the wafer 60 during the spin drying process.

Referring now to FIG. 4, the semiconductor fabrication system 50 is now in a second stage of the spin drying process. The wafer 60 is lowered vertically through the lowering of the wafer chuck 90. The speed at which the wafer 60 is lowered is substantially faster than the rate at which it was raised in the first stage of the spin drying process, or the rates at which it was raised or lower during the developing process. The downward acceleration of the wafer 60 while it is lowered can exceed the acceleration of gravity. In other words, the wafer 60 is pulled down faster than it can free fall. In some embodiments, the wafer 60 is lowered vertically at a speed in a range from about 0 meters/second to about 3 meters/second.

To facilitate the removal of the developer solution 80, the wafer 60 is also quickly rotated in a horizontal direction by the wafer chuck 90. The spin rate of the wafer 60 at this stage is substantially faster than the spin rate while it underwent the developing process in FIG. 2. The spin rate of the wafer 60 at this stage may also be faster than the spin rate of the wafer 60 when it was raised in the first stage of the spin drying process. In some embodiments, the wafer 60 is rotated at a speed in a range from about 0 rpm to about 3000 rpm.

Since the wafer 60 is lowered at a rapid speed, the developer solution 80 is effectively "pulled" upwards as the wafer is lowered. Meanwhile, the horizontal spinning of the wafer 60 creates a centrifugal force on the developer solution 80, which pulls the developer solution 80 "sideways." The combination of these two forces causes the developer solution 80 to leave the wafer 60 according to an angled upward trajectory, for example trajectories 160 (represented by the dashed arrows in FIG. 4). In other words, the trajectories 160 each have a horizontal component (in a plane defined by the X-Y directions) and a vertical component (along the Z-direction). The horizontal component is attributed to the centrifugal force as the wafer is quickly spun, and the vertical component is attributed to the rapid downward movement of the wafer 60. Compared to the first stage of the spin dry process where the wafer 60 is slowly raised, or situations where the wafer remains at a substantially constant vertical position while it is spun, the rapid lowering of the wafer 60 herein causes the developer solution 80 to be more effectively removed, since the developer solution 80 is effectively "pulled up" away from the wafer 60 in addition to being pulled sideways.

The exhaust components 130 are also operable to collect the removed developer solution 80 during this stage of fabrication. In some embodiments, the exhaust components 130 remain stable while the wafer 60 is lowered. In alternative embodiments, it is envisioned that the exhaust components 130 may move vertically during the lowering of the wafer 60 as well. It is understood that the back side rinsing module 110 may continue to dispense a cleaning liquid to the back side of the wafer 60 during this stage of the spin drying process. It is also understood that the first stage (i.e., raising the wafer) and the second stage (i.e., lowering the wafer) of the spin drying process may be repeated a plurality of cycles to ensure the removal of the developer solution to a satisfactory extent.

FIGS. 5A and 5B are diagrammatic fragmentary cross-sectional side views of the wafer 60 and the developer solution 80 during the second stage of the spin drying process discussed above. Specifically, FIG. 5A is a more detailed (i.e., zoomed-in) view of a portion of FIG. 5B. As shown in FIGS. 5A and 5B, the developer solution 80 is spun off of the wafer 60 as the wafer 60 is rapidly lowered in the vertical direction and rotated in the horizontal plane.

In some embodiments, the rapid lowering of the wafer 60 is faster than what is possible through gravity alone, i.e., faster than a free fall of the wafer 60. In more detail, in a simplified calculation, the developer solution 80 may be viewed as a particle following Newton's laws of motion. The downward force acting upon the developer solution 80 is defined by Newton's law of universal gravitation $F1=m*g$, where F1 is the downward force at which the wafer 60 is being pulled down by gravity, m is the mass of the developer solution, and g is the acceleration of gravity (g=9.8 meters/second$^2$).

Meanwhile, the wafer 60 itself is pulled down by a force such that the downward acceleration of the wafer 60 is faster than the acceleration of gravity. Hence, the wafer 60 accelerates downwards at a rate faster than 9.8 meters/second$^2$. Due to this rapid downward movement of the wafer 60, the developer solution 80 is in effect being "pulled up" and away from the wafer 60. Thus, it may be viewed that the developer solution 80 is accelerating upwards away from the wafer 60. Using hypothetical numbers to illustrate, the developer solution would naturally free fall at an acceleration equal to g, which is about 9.8 meters/second$^2$. If the wafer 60 is pulled downwards at an acceleration of 15 meters/second$^2$ (purely as an example), then the upward acceleration of the developer solution 80 with respect to the wafer 60 is 5.2 meters/second$^2$ (5.2=15−9.8). Note that this does not mean that the developer solution 80 is actually accelerating upwards relative to the ground/floor. Rather, the developer solution 80 is still experiencing free fall at rate equal to g. But relative to the reference that is the wafer 60, the developer solution 80 is moving away from the wafer 60 with an upward acceleration.

This upward acceleration of the developer solution 80 relative to the wafer 60 may be viewed as having a force pulling the developer solution 80 upwards. According to Newton's second law of motion—which states that the acceleration of a body is parallel and directly proportional to the net force F2 and inversely proportional to the mass—the developer solution 80 effectively experiences an upward pulling force F2 that is defined by the equation $F2=-m*a$, where m is the mass of the developer solution, and "a" is the acceleration of the developer solution 80 in the vertical direction (e.g., about 5.2 meters/second$^2$ in the example discussed above). Therefore, the faster the wafer 60 is pulled downwards, the greater the developer solution 80 accelerates upwards away from the wafer 60, and the greater the force pulling on the developer solution upwards is vertically.

The developer solution 80 is also removed horizontally, as the horizontal force pulling the developer solution 80 sideways is defined by the centrifugal force $Fc=m*w^2*r$, where m is the mass of the developer solution, w is the angular velocity of the spinning wafer, and r is the radius. The horizontal force and the vertical force combine to create a force 180 that has both a vertical component and a horizontal component, thereby forming an angle θ with the horizontal plane.

It is understood that the implementations of the various devices disclosed herein are merely examples and are not intended to be limiting. Other implementations may be used in alternative embodiments as long as they are consistent with the spirit and the scope of the present disclosure. For example, although a motor is used as the mechanism to spin and lower the wafer, other suitable devices or mechanisms may be used instead in alternative embodiments. In embodiments, one mechanism may be used to spin the wafer, while another mechanism may be used to raise or lower the wafer.

The semiconductor fabrication apparatuses and techniques according to various aspects of the present disclosure offer advantages over existing fabrication apparatuses and techniques. It is understood, however, that not all advantages are necessarily discussed herein for reasons of simplicity, and other embodiments of the present disclosure may offer additional advantages, and that no particular advantage is required for all embodiments.

One advantage is that the embodiments disclosed herein allow the developer solution to be removed from the wafer more effectively. As discussed above, developer solution, if not removed sufficiently from the wafer, may lead to defects on the wafer. Existing methods of removing developer solution do not allow the wafer to be moved vertically, and therefore does not allow the developer solution to be removed using a vertical pulling force. In comparison, the embodiments discussed herein implement a mechanism where the wafer can be raised and lowered while it is spinning. The developer solution may be more effectively removed due to the rapid lowering of the wafer in the spin drying process, since the lowering of the wafer in effect causes the developer solution on the wafer to be pulled upwards in addition to being pulled sideways. As such, the developer solution removal is more complete according to the present disclosure. Consequently, the fabricated semiconductor wafer will have fewer defects. Another advantage is that the implementation of the wafer cleaning apparatus disclosed herein is simple and can be integrated within current fabrication tools.

One of the broader forms of the present disclosure involves a method for fabricating a semiconductor device. The method includes: dispensing a liquid on a wafer; raising the wafer; and lowering the wafer after the raising, wherein the wafer is being spun as it is lowered, thereby removing at least a portion of the liquid from the wafer.

In some embodiments, the lowering the wafer is performed at a faster speed than the raising the wafer.

In some embodiments, the lowering the wafer is performed in a manner such that the wafer has a downward acceleration that exceeds an acceleration of gravity.

In some embodiments, the method further includes: placing the wafer on a wafer stage; wherein the raising the wafer and the lowering the wafer are both carried out through raising and lowering the wafer stage.

In some embodiments, the method further includes: repeating the raising the wafer and the lowering the wafer a plurality of cycles.

In some embodiments, the wafer extends in a planed defined by a first direction and a second direction perpendicular to the first direction; and the raising and the lowering are performed along a third direction that is orthogonal to the plane defined by the first and second directions.

In some embodiments, the wafer is being spun during the raising.

In some embodiments, the dispensing is performed during a developing process of a photolithography process; and the raising the wafer and the lowering the wafer are both performed during a spin drying process of the photolithography process.

In some embodiments, the liquid includes a photoresist developer solution used in the developing process.

Another one of the broader forms of the present disclosure involves a method of fabricating semiconductor device. The method includes: securing a semiconductor wafer on a wafer chuck; dispensing a developer solution on the wafer; and thereafter performing a spin drying process to remove the developer solution from the wafer, wherein the spin drying process includes a plurality of dying cycles, each drying cycle including: moving the wafer upwards vertically at a first speed while the wafer is being rotated horizontally; and moving the wafer downwards vertically at a second speed while the wafer is being rotated horizontally.

In some embodiments, the second speed is substantially greater than the first speed.

In some embodiments, the second speed is a variable speed that corresponds to an acceleration greater than about 9.8 meters/second$^2$.

In some embodiments, the moving the wafer upwards and downwards are each performed by moving the wafer chuck vertically.

In some embodiments, the method further includes, before the dispensing the developer solution: forming a photoresist layer on the wafer; exposing the photoresist layer; and developing the exposed photoresist layer to form a plurality of photoresist patterns; wherein the dispensing the developer solution is performed as a part of the developing the exposed photoresist layer.

In some embodiments, the developing the photoresist layer further comprises moving the wafer in a vertical direction during the dispensing the developer solution.

Yet another one of the broader forms of the present disclosure involves an apparatus for fabricating a semiconductor device. The apparatus includes: a wafer chuck that is operable to hold a semiconductor wafer and secure the wafer thereto, the wafer having a front surface and a back surface; a dispenser that is operable to dispense a liquid to the front surface of the wafer; and a mechanical structure that is operable to: spin the wafer chuck in a horizontal direction; and move the wafer chuck downwards in a vertical direction while the wafer chuck is being rotated.

In some embodiments, the mechanical structure is operable to move the wafer chuck downwards at an acceleration faster than an acceleration of gravity.

In some embodiments, the mechanical structure is operable to move the wafer chuck upwards vertically while the wafer chuck is being rotated.

In some embodiments, the wafer chuck includes an electronic chuck; the mechanical structure includes a motor; and the dispenser is operable to dispense a photoresist developer solution as the liquid.

In some embodiments, the apparatus further includes: an exhaust device disposed proximate to the wafer, the exhaust device being operable to suck the liquid on the wafer into the exhaust device.

The foregoing has outlined features of several embodiments so that those skilled in the art may better understand the detailed description that follows. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions and alterations herein without departing from the spirit and scope of the present disclosure.

What is claimed is:

1. A method, comprising:
dispensing a liquid on a wafer;
raising the wafer; and
lowering the wafer after the raising, wherein the wafer is being spun as it is lowered, thereby removing at least a portion of the liquid from the wafer, and wherein the lowering the wafer is performed at a faster speed than the raising the wafer.

2. The method of claim 1, wherein the lowering the wafer is performed in a manner such that the wafer has a downward acceleration that exceeds an acceleration of gravity.

3. The method of claim 1, further comprising: placing the wafer on a wafer stage;
wherein the raising the wafer and the lowering the wafer are both carried out through raising and lowering the wafer stage.

4. The method of claim 1, further comprising: repeating the raising the wafer and the lowering the wafer a plurality of cycles.

5. The method of claim 1, wherein:
the wafer extends in a plane defined by a first direction and a second direction perpendicular to the first direction; and
the raising and the lowering are performed along a third direction that is orthogonal to the plane defined by the first and second directions.

6. The method of claim 1, wherein the wafer is being spun during the raising.

7. The method of claim 1, wherein:
the dispensing is performed during a developing process of a photolithography process; and
the raising the wafer and the lowering the wafer are both performed during a spin drying process of the photolithography process.

8. The method of claim 7, wherein the liquid includes a photoresist developer solution used in the developing process.

9. A method of fabricating a semiconductor device, comprising:
securing a semiconductor wafer on a wafer chuck;
dispensing a developer solution on the wafer; and
thereafter performing a spin drying process to remove the developer solution from the wafer, wherein the spin drying process includes a plurality of drying cycles, each drying cycle including:
moving the wafer upwards vertically at a first speed while the wafer is being rotated horizontally; and
moving the wafer downwards vertically at a second speed while the wafer is being rotated horizontally.

10. The method of claim 9, wherein the second speed is substantially greater than the first speed.

11. The method of claim 9, wherein the second speed is a variable speed that corresponds to an acceleration greater than about 9.8 meters/second$^2$.

12. The method of claim 9, wherein the moving the wafer upwards and downwards are each performed by moving the wafer chuck vertically.

13. The method of claim 9, further comprising, before the dispensing the developer solution:
forming a photoresist layer on the wafer;
exposing the photoresist layer; and
developing the exposed photoresist layer to form a plurality of photoresist patterns;
wherein the dispensing the developer solution is performed as a part of the developing the exposed photoresist layer.

14. The method of claim 13, wherein the developing the photoresist layer further comprises moving the wafer in a vertical direction during the dispensing the developer solution.

15. A method, comprising:
applying a liquid solution on a wafer;
raising the wafer vertically; and
lowering the wafer after the raising, wherein the lowering of the wafer is performed in a manner such that the wafer has a downward acceleration that exceeds an acceleration of gravity, and wherein the wafer is being rotated horizontally as it is lowered, thereby removing at least a portion of the liquid from the wafer.

16. The method of claim 15, wherein the lowering of the wafer is performed at a faster speed than the raising of the wafer.

17. The method of claim 15, further comprising: repeating the raising of the wafer and the lowering of the wafer a plurality of times.

18. The method of claim 15, wherein the raising the wafer is performed such that the wafer is being rotated horizontally as it is raised.

19. The method of claim 15, wherein:
the applying the liquid solution is performed during a developing process of a photolithography process; and
the raising of the wafer and the lowering of the wafer are both performed during a spin drying process of the photolithography process.

20. The method of claim 19, wherein the liquid solution includes a photoresist developer solution used in the developing process.

* * * * *